United States Patent [19]
Reymond

[11] Patent Number: 5,160,270
[45] Date of Patent: Nov. 3, 1992

[54] INTEGRATED CIRCUIT PACKAGES USING TAPERED SPRING CONTACT LEADS FOR DIRECT MOUNTING TO CIRCUIT BOARDS

[75] Inventor: Welles K. Reymond, Waterbury, Conn.

[73] Assignee: General DataComm, Inc., Middlebury, Conn.

[21] Appl. No.: 697,201

[22] Filed: May 8, 1991

Related U.S. Application Data

[63] Continuation-in-part of Ser. No. 605,521, Oct. 29, 1990, and a continuation-in-part of Ser. No. 605,523, Oct. 29, 1990, and a continuation-in-part of Ser. No. 605,522, Oct. 29, 1990, abandoned, said Ser. No. 605,521, is a continuation of Ser. No. 366,546, Jun. 13, 1989, Pat. No. 4,966,556, said Ser. No. 605,523, and Ser. No. 605,522, is a continuation-in-part of Ser. No. 336,546.

[51] Int. Cl.$^5$ .............................................. H05K 1/00
[52] U.S. Cl. ........................................ 439/70; 439/82; 439/330
[58] Field of Search ................................. 439/80–83, 439/68–73, 525, 526, 620, 554, 558, 326–331; 361/400, 404, 405, 406, 408

[56] References Cited

U.S. PATENT DOCUMENTS

| | | | |
|---|---|---|---|
| 2,899,515 | 8/1959 | Schuler | 200/275 |
| 3,226,502 | 12/1965 | Schutz | 200/551 |
| 3,290,636 | 12/1966 | Overtveld | 439/66 |
| 3,747,045 | 7/1973 | Stross | 361/405 |
| 3,749,859 | 7/1973 | Webb et al. | 200/516 |
| 3,899,231 | 8/1975 | Bray | 361/408 |
| 4,009,921 | 1/1977 | Narozny | 439/400 |
| 4,037,899 | 7/1977 | Crowell | 439/83 |
| 4,095,867 | 6/1978 | Parks | 439/329 |
| 4,417,095 | 11/1983 | Beun | 439/83 |
| 4,663,695 | 5/1987 | Ohkawara et al. | 361/425 |
| 4,667,270 | 5/1987 | Yagi | 361/400 |
| 4,771,139 | 9/1988 | DeSmet | 200/516 |
| 4,806,104 | 2/1989 | Cabourne | 439/591 |
| 5,007,844 | 4/1991 | Mason et al. | 439/68 |

FOREIGN PATENT DOCUMENTS

| | | | |
|---|---|---|---|
| 2742716 | 4/1979 | Fed. Rep. of Germany | 361/405 |
| 2806683 | 8/1979 | Fed. Rep. of Germany | 361/405 |
| 206258 | 1/1984 | Fed. Rep. of Germany | 200/275 |

OTHER PUBLICATIONS

IBM Bulletin, Faure, vol. 17, No. 2, p. 444, Jul. 1974.
IBM Bulletin, Schick, vol. 6, No. 10, p. 5, Mar. 1964.
Research Disclosure, Kenneth Mason Publications Ltd. No. 280, p. 28018, Aug. 1987.

*Primary Examiner*—David L. Pirlot
*Attorney, Agent, or Firm*—David P. Gordon

[57] ABSTRACT

An integrated circuit package is provided with a plurality of contact element leads, each lead having a first portion for making electrical connection with the integrated circuit and a second tapered contact portion for mating with a conductive rim of the hole of a circuit board. In conjunction with the integrated circuit package, a fastener is provided for holding the tapered contact elements in mating relationship with the conductive rims. The tapered contact portion of the lead of the integrated circuit package may take any of various forms, as long as the lead is tapered and resilient so that proper mating with a conductive rim can be accomplished. Likewise, the fastener which holds the tapered contact elements in mating relationship with the conductive rims may take any of numerous forms. All that is required is that the fastener couple to both the circuit board and the integrated circuit package, and that the integrated circuit package be removable from the fastener.

22 Claims, 8 Drawing Sheets

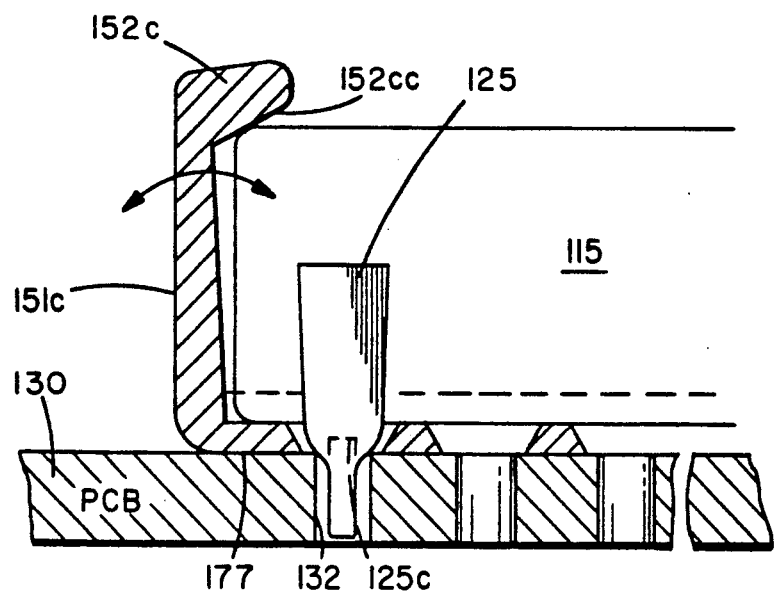
FIG. 5C
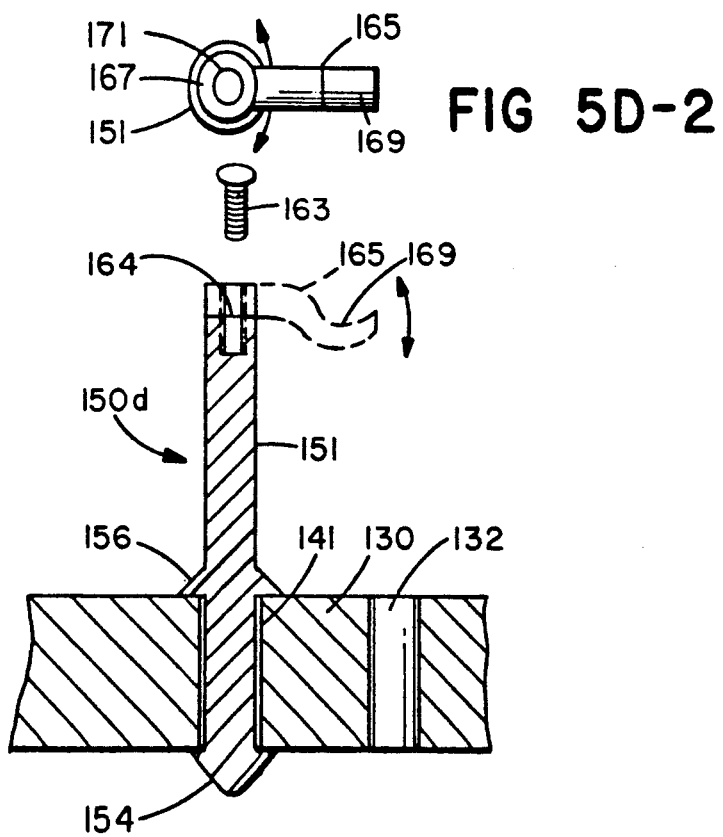
FIG 5D-2
FIG 5D-1

INTEGRATED CIRCUIT PACKAGES USING TAPERED SPRING CONTACT LEADS FOR DIRECT MOUNTING TO CIRCUIT BOARDS

This is a continuation-in-part of Ser. Nos. 07/605,521, 07/605,523, and 07/605,522 now abandoned which are hereby incorporated by reference herein in their entirety, and which are respectively a continuation, a continuation-in-part, and a continuation-in-part of Ser. No. 07/366546 filed Jun. 13, 1989 which is issued as U.S. Pat. No. 4,966,556.

BACKGROUND

1. Field of the Invention

This invention relates generally to the electrical connection of integrated circuit packages to circuit boards. More particularly, the invention relates to the packaging of integrated circuits for the removable mounting of the integrated circuits to host boards. The invention has application to all types of integrated circuits.

2. Prior Art

Integrated circuit packages (ICPs) are substantially divided into two main categories. The categories are through-hole technology (THT), and surface mount technology (SMT). Examples of three common generic IC packages using the through hole technology are seen in prior art FIGS. 1a-1c.

In FIG. 1a, a cross-section through a plastic (N-type) dual-in-line package (DIP) is seen. The N type DIP consists of a circuit mounted on a lead frame having a desired number of leads, where the circuit is encapsulated within an electrically nonconductive plastic compound. The leads of the package of FIG. 1a are formed by stamping a flat sheet of lead material to form a lead frame, and bending the leads of the lead frame appropriately after the integrated circuit has been mounted on the lead frame and encapsulated, so that the leads may be inserted and soldered into mounting-hole rows of a circuit board.

A cross-section through a JD ceramic DIP is shown in FIG. 1b. The JD ceramic DIP has a hermetically sealed ceramic package with a metal cap and with side-brazed tin-plated leads. As with the N dual-in-line package, the leads of the JD ceramic DIP are intended for insertion and soldering into mounting-hole rows of a circuit board.

A partially cutaway top view of a GB pin-grid-array ceramic package is seen in FIG. 1c. Like the JD ceramic dual-in-line package of FIG. 1b, the GB pin-grid-array ceramic package is also a ceramic package which is hermetically sealed with a metal cap. However, the "leads" of the GB pin-grid-array ceramic package are typically gold-plated pins which are arranged substantially in two squares which surround the hermetically sealed ceramic package. The pins may be inserted and soldered into corresponding mounting holes of a circuit board, or as described in more detail hereinafter, and as is more commonly the case with GB pin-grid array ceramic packages, the package may be inserted into IC sockets which are inserted and soldered into the circuit board.

Examples of three common generic IC packages using the surface mount technology are seen in prior art FIGS. 2a-2c. In FIG. 2a, a perspective view of a D plastic small outline package is seen. The D plastic small outline package is manufactured in a similar manner to, and corresponds closely to the N dual-in-line package, as it consists of a circuit mounted on a lead frame and encapsulated within a plastic compound. The only difference is that the free ends of the leads, instead of being straight for insertion into holes, are bent through approximately ninety degrees (i.e. "gull-wing" bent) for surface mounting.

A top view of an HQ quad flat package is seen in FIG. 2b. The HQ quad flat package is similar to the D plastic small outline package of FIG. 2a, except that the circuit is hermetically sealed, and the gull-wing bent leads are located on all four sides of the chip.

Turning to FIG. 2c, a partially sectioned side view of a FN plastic chip carrier package (PCC package) is seen. As with the D plastic small outline package, the PCC package consists of a circuit mounted on a lead frame and encapsulated within an electrically nonconductive compound. However, instead of two sets of parallel gull-wing bent leads, the leads are "J" leads which extend around the package in a square configuration. The J leads of the PCC package are surface mount soldered to solder lands.

Common to both the through hole packages and the surface mount packages is that in their basic forms, some kind of soldering process is used to fasten the ICPs to the host board for establishing electrical connection between the IC and the board. From a practical point of view, the soldering is a permanent process.

Although most, if not all, of the surface mount and through hole packages are intended to be soldered into contact with a circuit board, some subsets of the two main categories have been provided with IC sockets. The IC sockets effectively act as an interface or an interlocutor between the ICP and the circuit board. Typically, the IC sockets have contacts having a first portions for individually contacting the leads of the ICP, and second portions, which are typically pins, for insertion into and contact with the circuit board. The IC sockets serve various functions, including avoiding the SMT process on a THT board by putting the SMT package in a socket which is soldered into through holes, and providing the ability to replace the IC with a different IC, which is particularly important in updating ROMs.

While IC sockets serve important functions, they have several drawbacks. First, because of their function, the IC sockets introduce an additional physical connection into each circuit. Instead of a single connection where the pins or leads of the ICP contact the circuit board directly, two connections are required; a first connection on between the pins or leads and the IC socket, and a second connection between the pins or leads of the socket and the circuit board. This is a drawback, as every additional connection is a potential failure point, and thus system reliability is decreased. Second, the IC sockets are relatively costly. Third, special tools are often required to extract the ICPs from the IC sockets, and the ICPs can be damaged during extraction. A fourth drawback is that the IC sockets cause the ICPs to be lifted relative to the circuit board, thereby limiting the proximity in which two boards or the board and an additional object may be located.

SUMMARY OF THE INVENTION

It is therefore an object of the invention to provide integrated circuit packages having tapered contacts leads which mate directly with the conductive rims of holes of a circuit board.

It is another object of the invention to provide integrated circuit packages with modified posts or leads which will mate directly with the conductive rims of holes of a circuit board.

It is a further object of the invention to provide methods for altering the leads of a standard integrated circuit package so that the altered package, in conjunction with fastening means, will mate directly with the conductive rims of holes of a circuit board without soldering.

It is yet another object of the invention to provide integrated circuit packages which eliminate the need for soldering the integrated circuit to a circuit board, and which do not introduce additional electrical connections, nor the requirement of using complex tools.

In accord with the objects of the invention, an integrated circuit package is provided with a plurality of contact element leads, each lead having a first portion for making electrical connection with the integrated circuit and a second tapered contact portion for mating with a conductive rim of the hole of a circuit board. In conjunction with the integrated circuit package, a fastening means is preferably provided for holding the tapered contact elements in mating relationship with the conductive rims.

The tapered contact portion of the lead of the integrated circuit package may take any of various forms. For example, the leads of a standard DIP may be modified into tapered form for contact with a conductive rim of a hole by bending the bottoms of the leads upward into a v-shape. Alternatively, the leads may take any of the forms shown in the parent applications hereto. All that is required is that the the lead be tapered and resilient so that proper mating with a conductive rim can be accomplished. Likewise, the fastening means which holds the tapered contact elements in mating relationship with the conductive rims may take any of numerous forms. All that is required is that the fastening means couple to both the circuit board and the integrated circuit package, and that the integrated circuit package be removable from the fastening means.

According to another aspect of the invention, the fastening means may be a molded plastic assembly which is bonded to a circuit board and which includes a hold down mechanism for the integrated circuit package. The fastening means may also include guiding means which helps guide the tapered leads of the integrated circuit package into mating contact with the conductive rims of the circuit board.

Other objects and advantages of the present invention will become evident upon reference to the detailed description in conjunction with the provided figures.

BRIEF DESCRIPTION OF THE DRAWINGS

FIG. 3c is a top view of a modified lead of the modified lead DIP of FIG. 3a;

FIGS. 5a–5c show three different fastening means for causing an integrated circuit package to be fastened to a circuit board;

FIGS. 5d1 and 5d2 show a cross section and a plan view respectively of a fourth fastening means for causing an integrated circuit package to be fastened to a circuit board;

DETAILED DESCRIPTION OF THE PREFERRED EMBODIMENT

Before describing the preferred embodiments of the invention it should be appreciated that the integrated circuit package invention as described herein is for permitting an integrated circuit to be removably mated with the conductive rims of the holes of an object. The holes of the object need not be through holes or plated through holes, as connections with blind holes or holes having only a plated rim are envisioned. Further, even though the invention has advantageous application to the printed circuit board technology, the object in which the holes are located need not be a printed circuit board (PCB), as connection to other objects (e.q., flex circuits) is envisioned. Thus, for purposes of the specification and claims, the term "circuit board" is to be interpreted in its broadest sense to include flex circuits and other circuits which are attached to a substrate as well as a PCB. Also, while the invention is mostly described wit reference to a modified DIP chip, it will be appreciated that the description applies equally to any type of integrated circuit chip having leads which extend therefrom.

Figure 1A:
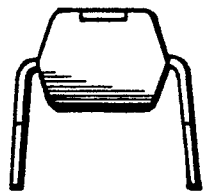
FIG. 1a is a cross-section through a prior art plastic dual-in-line package (DIP) for through-hole technology.
Figure 3A:
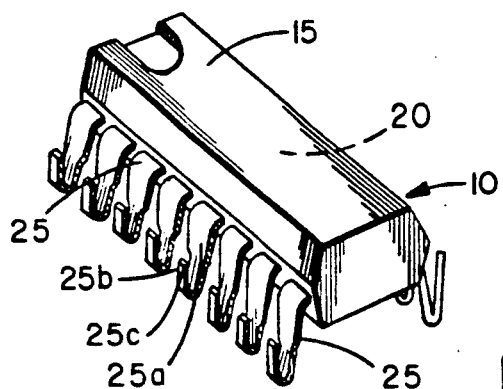
FIG. 3a is a perspective of a DIP with modified leads in accord with the invention.
Figure 3C:
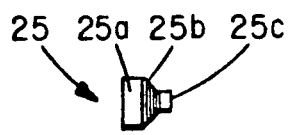
Figure 3B:
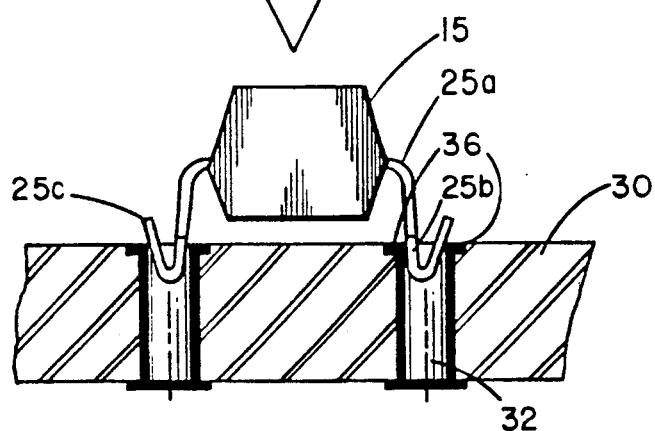
FIG. 3b is a cross section through the modified lead DIP of FIG. 3a in its mating position with the rims of holes in a circuit board.

Turning to FIGS. 3a and 3b, a DIP 10 which is in modified form from FIG. 1a is seen with a plastic package 15 encapsulating an integrated circuit 20, and with leads 25 which are electrically coupled to the encapsulated integrated circuit 20. The leads 25 as shown, have two sections: a wide section 25a which extends radially out of the plastic package 15 of chip 10 and bends downward by approximately ninety degrees; and a thinner v-shaped section 25b which extends downward from wide section 25a, is bent through approximately one hundred and fifty degrees (e.g. into a v-shape), and then extends upwards to terminate at end 25c. As seen in FIG. 3b, at least some of the v-shaped portion of leads 25 fits into holes 32 of circuit board 30. Because a v- shape is by its nature tapered, parts of the v-shaped portion of leads 25 in fact contact the rim of 36 of hole 32, thereby establishing electrical contact between the lead 25 and the PCB 30. Because it is desirable for the DIP 10 to be removably mounted in the PCB 30, the leads 25 of DIP 10 are arranged such that the v-shape is wide enough such that the terminating tip 25c of the lead 25 will be outside the hole 32 (i.e. extend above as seen in FIG. 3b) in circuit board 30.

It will be appreciated that DIP 10 of FIGS. 3a and 3b is modified from that of FIG. 1a simply in that the leads are bent to provide tapered, resilient leads 25. Thus, the modified DIP 10 of the invention can be manufactured by bending the leads of already manufactured DIPs. Preferably, however, the manufacture of the standard DIP is also slightly modified in that a more springy lead frame material than is usually employed in DIPs is used. The more springy lead frame material permits leads 25 to be more resilient and to function more effectively in mating with the conductive rim of the hole of the PCB. More particularly, since the leads 25 are bent after they extend out of the plastic package by approximately ninety degrees, considerable axial compliance is provided. Also, since the V-shape of the leads provides taper, considerable radial compliance is also provided.

Figure 3D:
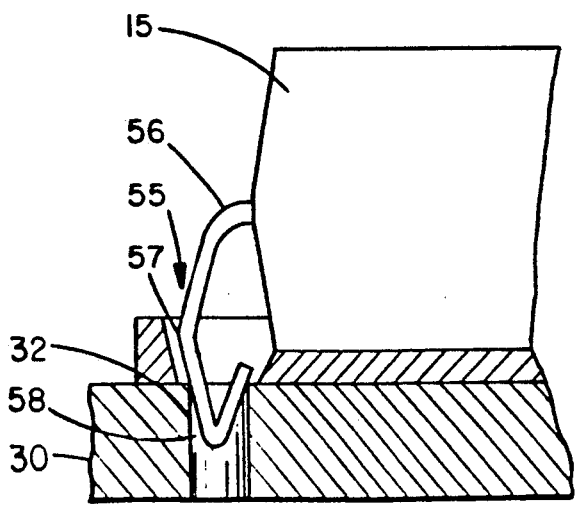
FIG. 3d is an end view a DIP with modified leads where the leads are bent in an alternative manner.

Those skilled in the art will appreciate that the leads of a DIP can be bent in different ways to accomplish the same result. For example, as shown in FIG. 3d, a lead 55 is first bent downward by about seventy degrees at 56, followed by an inward bend of approximately forty degrees at 57, and then an approximately one hundred fifty degree bend at 58 (which forms the v-shape).

Figure 4A:
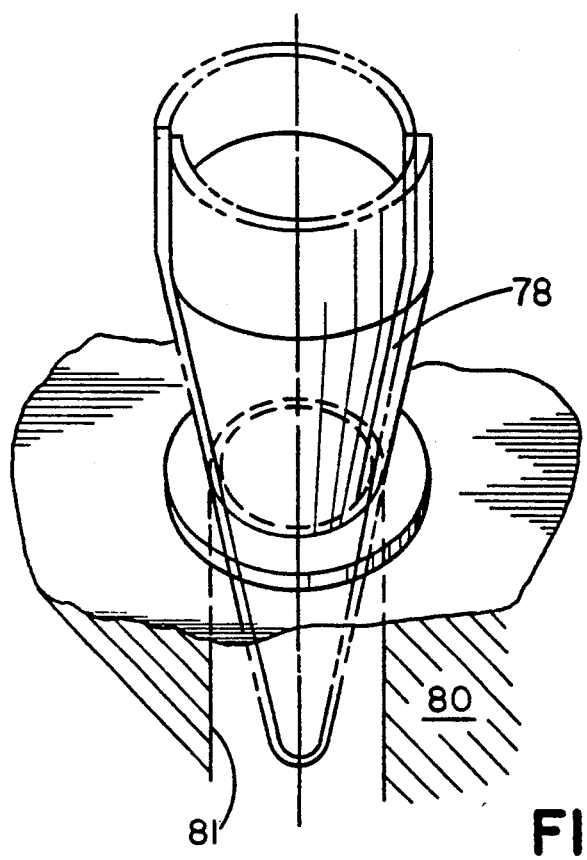
FIGS. 4a and 4b are perspective views of two different tapered leads suitable for use with integrated circuit packages of the invention.
Figure 4B:
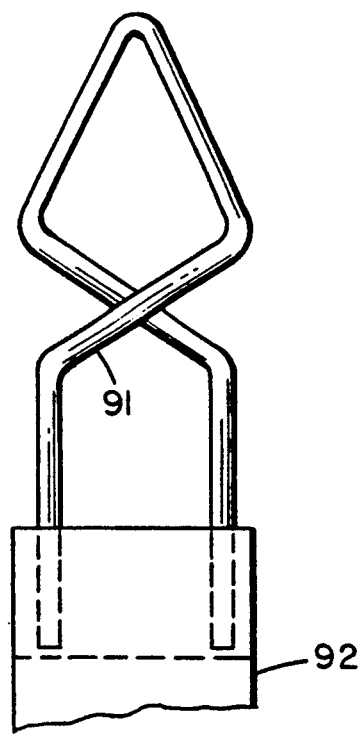

As seen in FIGS. 4a and 4b, the leads of the modified DIP 10 of FIGS. 3a and 3b, or for that matter, the leads of any integrated circuit package of the invention, can take various forms. FIG. 4a shows a bifurcated tapered compliant cone 78 in mating position with a hole 81 in a circuit board 80 as described more fully in U.S. Pat. No. 4,966,556 which was previously incorporated by reference herein. FIG. 4b shows a formed wire 91 which extends from a post 92 and which provides considerable radial compliance and little axial compliance as described in parent application Ser. No. 07/605,523 which was also previously incorporated by reference herein. It will be appreciated that other tapered leads, including but not limited to those described in the parent applications hereto, which provide radial and/or axial compliance can be advantageously utilized in accord with the teachings of this invention.

Figure 5A:
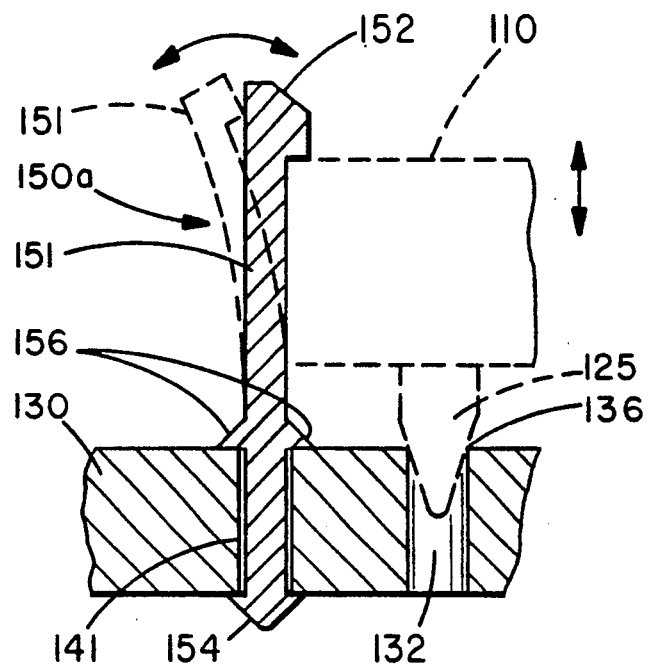

In order to keep the leads of the ICP mated with the rims of the PCB, a fastening means is required. Four different fastening means are seen in FIGS. 5a, 5b, 5c, and 5d-1 and 5d-2. In FIG. 5a, a first fastening means 150a is seen. Fastening means 150a comprises a resilient plastic post 151 having a holding lip 152 at one end, a barb 154 at the other end, and a protrusion 156 in the middle. The barb 154 is resiliently formed so that it can be forced through hole 141 in the circuit board 130, but cannot be easily removed once forced through. Protrusion 156 is provided as a stop such that the fastening means 150a can be fixed in place prior to the insertion of an integrated circuit chip (shown in phantom) 110 onto the PCB 130. Lip 152 is provided to hold down the integrated circuit chip 110.

As indicated by the arrows and the phantom movement of post 151 in FIG. 5a, the plastic post 151 of the fastening means 150a is flexible and resilient, and can be bent out of the way in order to permit insertion of the integrated circuit chip 110. Once the compliant leads 125 of the integrated circuit chip 110 are partially inserted into holes 132 of the circuit board such that mating is accomplished at the rims 136 of the holes, the chip 110 is preferably held down for clearance, and plastic post 151 may be released into its unstressed position such that lip 152 will hold chip 110 in its mating engagement with the PCB 130. Those skilled in the art will appreciate that preferably, at least two fastening means 150a (one on either end) are provided to fasten chip 110 to board 130.

Figure 5B:
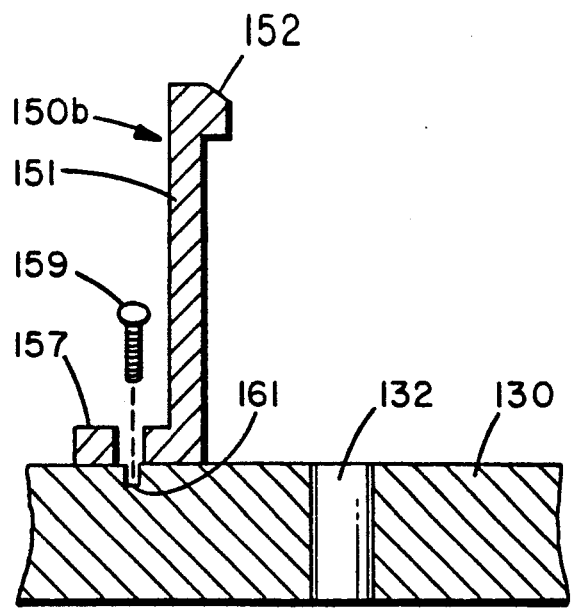

A second fastening means 150b which does not require a through hole in circuit board 130 is seen in FIG. 5b. The second fastening means 150b comprises a flexible, resilient plastic post 151 having a holding lip 152 at one end, and a tail 157 with a hole 161 for accepting a screw 159 or other fastener extending therethrough at the other end. Tail 157 may extend in any desired direction, and the hole 161 may be tapped or not as desired. The second fastening means 150b is assembled on PCB 130 by tapping or screwing the fastener 159 through the hole 161 in the tail 157 and into the PCB 130 and tightening the fastener 159 so that the tail 157 of the second fastening means is tightly fastened to the PCB 130. Second fastening means 150b then functions in an essentially identical manner to the first fastening means 150a described with reference to FIG. 5a.

A third fastening means 150c is intended for attachment to the circuit board 130 by cementing or the like (as described more fully hereinafter with reference to FIGS. 6a–6d). The third fastening means 150c comprises a base section 177, and a flexible, resilient plastic post 151c having a holding lip 152c. The holding lip 152c is preferably angled in a non-perpendicular fashion relative to the plastic post 151c such that the bottom surface 152cc of holding lip 152c extends upward as it extends away form the resilient plastic post 151c. In this manner, tolerance to the height of the ICPs is obtained, as the plastic post 151c will bend as required (as indicated by the arrows) to permit the bottom 152cc of holding lip 152c to engage the corner of the ICP and hold it in place.

Figure 1B:
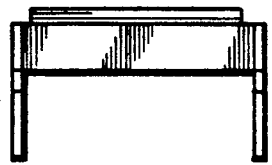
FIG. 1b is a cross-section through a prior art JD ceramic DIP for through-hole technology.
Figure 1C:
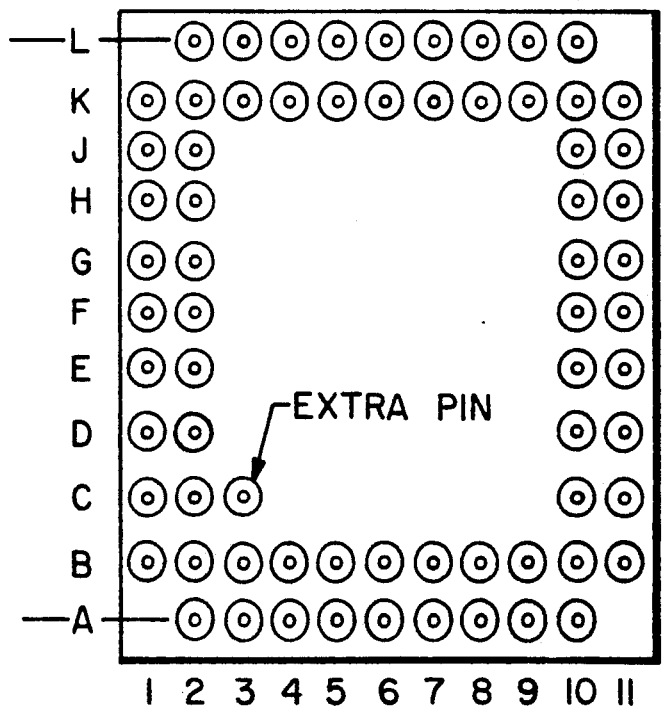
FIG. 1c is a partially cutaway top view of a prior art GB pin grid-array ceramic package for through-hole technology.
Figure 2A:
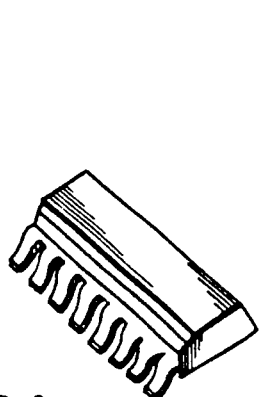
FIG. 2a is a perspective of a prior art D plastic small outline package for surface mount technology.
Figure 2C:
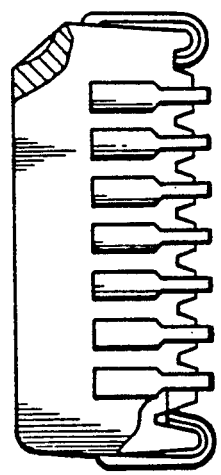
FIG. 2c is a partially sectioned side view of a prior art FN plastic chip for surface mount technology.
Figure 2B:
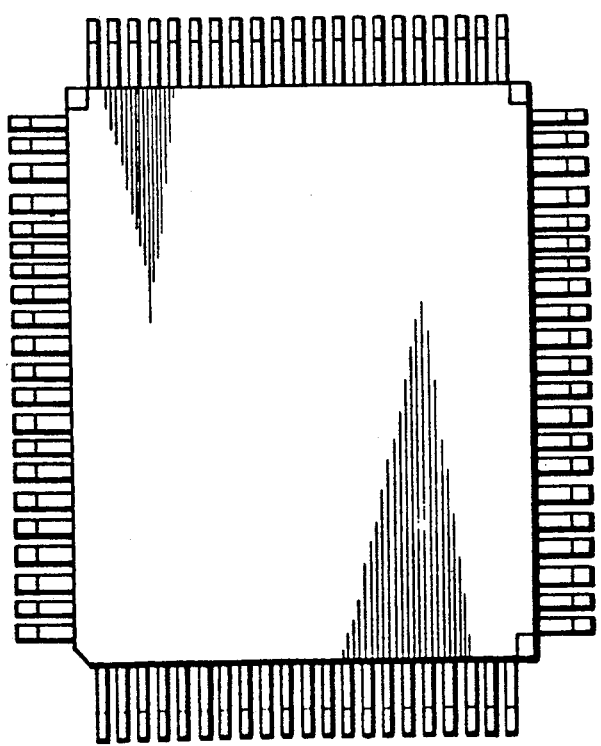
FIG. 2b is a top view of a prior art HQ quad flat package for surface mount technology.

A fourth fastening means 150d is shown in FIGS. 5d-1 and 5d-2. The third fastening means 150d comprises a post 151 having a resilient barb 154 on one end, a protrusion 156 in the middle, and a threaded hole 164 countersunk in the top end, and a tab 165 having curved portion 169 and a corresponding hole 171. The barb 154 is resiliently formed so that it can be forced through hole 141 in the circuit board 130, but cannot be easily removed once forced through. Protrusion 156 is provided as a stop such that the fastening means 150d can be fixed in place prior to the insertion of an integrated circuit chip. The tab 165 is arranged such that when a screw 163 is engaged in hole 164 but not tightened completely, the tab 165 can rotate (as shown in FIG. 5d-2) so that it is not in the way when a chip having tapered spring contact leads is placed adjacent board 130. The tab 165 may then be rotated back into position. When rotated back into position, a curved portion 169 of the tab will contact the top of the chip, thereby slightly cocking the tab 165 (as indicated by the arrow of FIG. 5d1. The tab 165 is then fastened to the post 151 by a fastener 163. As the tab 165 is fastened, the pressure supplied by curve 169 on the chip 110 will force the tapered leads of the chip 110 into mating engagement with the rims of holes 132 in the PCB 130.

Figure 6A:
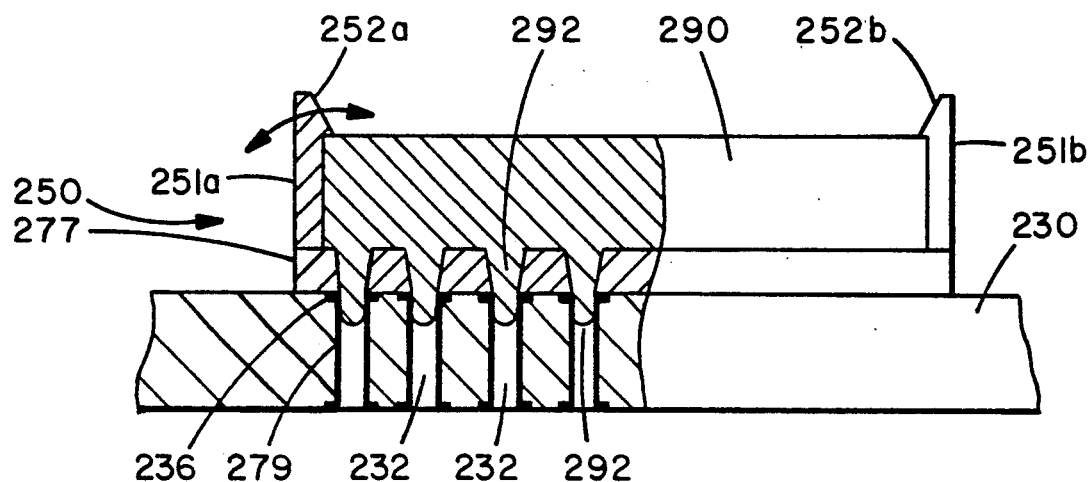
FIGS. 6a and 6b are respectively longitudinal and horizontal cross sections through a fastening/guiding means and a fastening alignment means in conjunction with a circuit board.
Figure 6B:
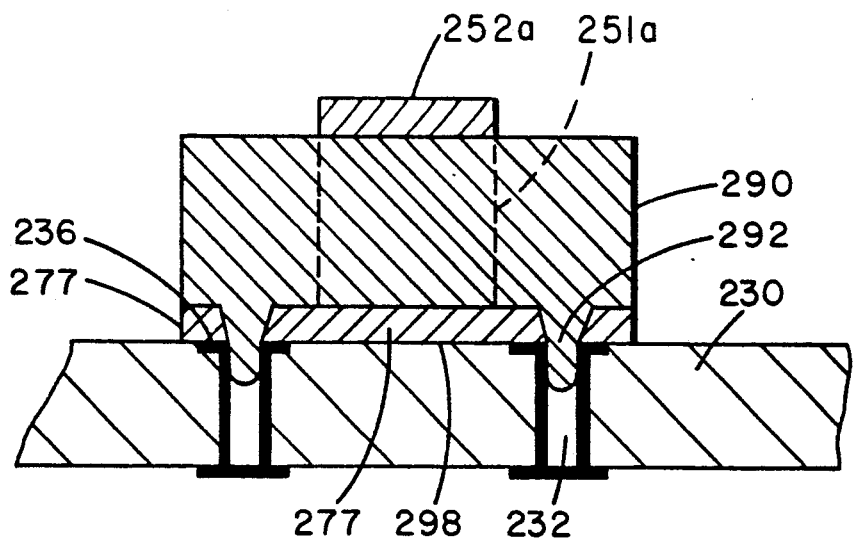

Another fastening means 250 is seen in FIGS. 6a and 6b. Fastening means 250 which is preferably comprised of a single integral molded piece includes flexible boards or beams 251, and guiding plate 277 which connects the flexible beams 251 at their bottom ends. The top ends of flexible beams 251 have respective lips 252. Guiding plate 277 has tapered or funnel holes 279 which decrease in size as they extend downward through the guiding plate 277.

As seen in FIGS. 6a and 6b, fastening means 250 is intended to be bonded at its bottom surface 298 to the top surface of PCB 230. Bonding may be accomplished via any of several processes, such as, e.g., thermal processes, or cementing or gluing (as suggested above with reference to FIG. 5c). In order to line up the holes 279 in the guiding plate 277 with the holes 232 in PCB 230 during the bonding process, an aligning means 290 is provided with tapered pins 292 which fit funnel holes 279 and which engage holes 232 of the circuit board. Aligning means 290, including tapered pins 292, is preferably nonconductive (e.g. plastic) and may be kept in place until replacement with an integrated circuit chip is desired. At that time, the aligning means 290 is removed from the fastening means 250 by flexing the flexible beams 251 as indicated in FIG. 6a until the lips 252 no longer engage the top of the aligning means 290.

Figure 6C:
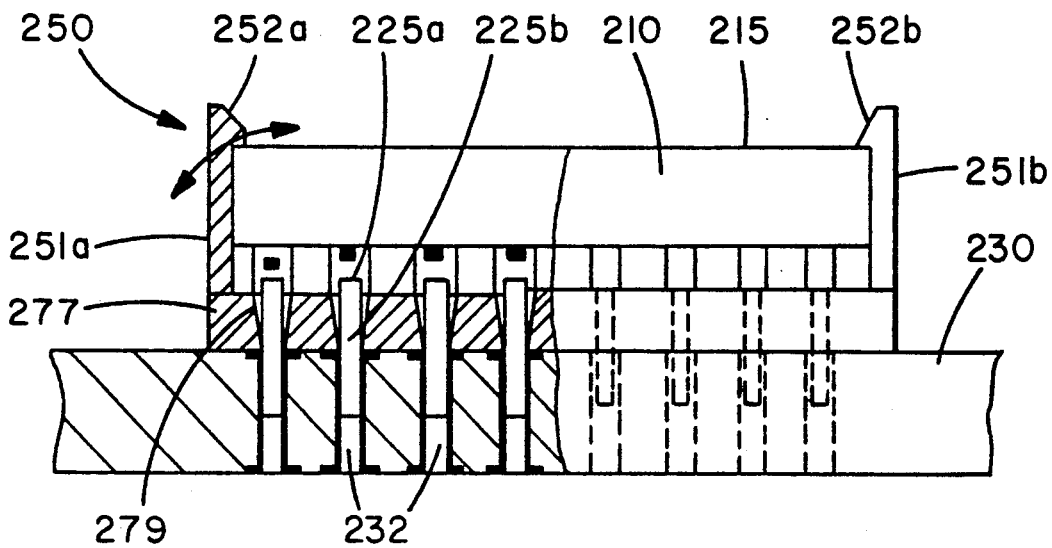
FIGS. 6c and 6d are respectively longitudinal and horizontal cross sections through an integrated circuit package, a circuit board to which the integrated circuit package is connected, and the fastening/guiding means of FIGS. 6a and 6b which guides the leads of the integrated circuit package and holds the integrated circuit package in place.
Figure 6D:
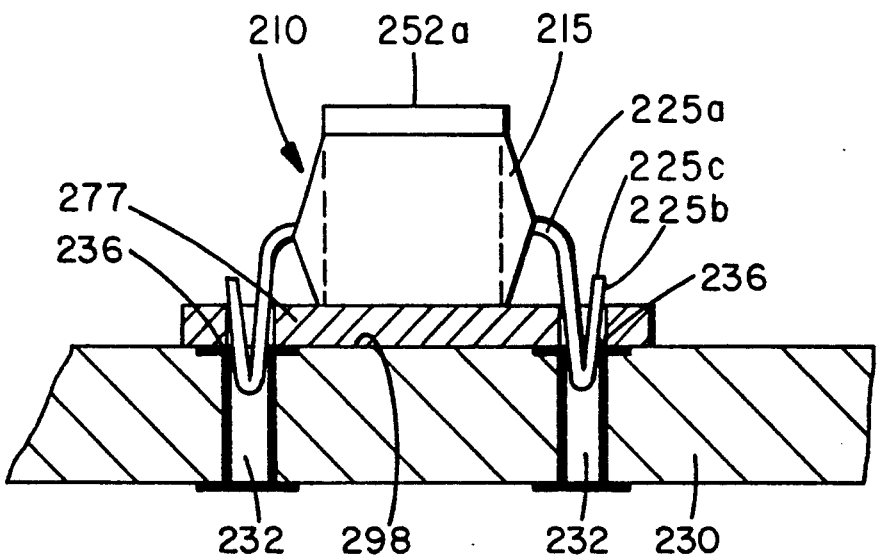

With the fastening means 250 bonded in place, and the aligning means 290 removed, the integrated circuit chip 210 of the invention can be brought and held in mating contact with the PCB as shown in FIGS. 6c and 6d. As seen in FIGS. 6c and 6d, the integrated circuit chip 210 shown is a modified DIP as described with reference to FIGS. 3a and 3b, having leads 225 with wider portion 225a and v-shaped portions 225b which mate in holes 232 of the PCB 230. The tapered holes 279 in the guiding plate 277 of the fastening means 250 act as guides for leads 225 when the chip 210 is located over the PCB 230 and when the leads 225b are brought into contact with the rims 236 of holes 232. As with the aligning means 290, the lips 252 of the beams 251 are utilized to apply a downward force which holds the leads 225 in mated engagement with the conductive rims 236.

There has been disclosed herein integrated circuit packages utilizing tapered spring contact leads for direct mounting on circuit boards. Electrical connection is made between the tapered spring contact leads and the conductive rims of the circuit boards. While particular embodiments of the invention have been described, it is not intended that the invention be limited thereby, as it is intended that the invention be broad in scope and that the specifications be read likewise. Thus, while the invention was described with particular reference to N-type DIP chips, it will be appreciated that the tapered leads and fastening means described will also apply to ceramic DIPs, pin-grid-array packages, surface mounted packages, and any other type of integrated circuit chips available. Also, while particular tapered arrangements for leads have been described, it will be appreciated that other arrangements could be utilized provided the leads are tapered and arranged to mate with the conductive arms of holes. Further, while particular fastening means for holding the tapered leads in mating contact with the conductive rims have been described, it will be appreciated that numerous other fastening means and arrangements can be provided which utilize none, some, or all of the fastening concepts set forth herein. For example, a simple fastener having two screw accepting posts which attach to the circuit board and a bar with screw holes which extends over the chip and which is screwed down to force the chip into mating engagement could be utilized. Therefore, it will be apparent to those skilled in the art that other changes and modifications may be made to the invention as described in the specification without departing from the spirit and scope of the invention as so claimed.

I claim:

1. In combination, an integrated circuit package and a fastening means, said integrated circuit package having an integrated circuit and a plurality of conductive lead elements, first ends of said conductive lead elements being coupled to said integrated circuit, wherein each of said conductive lead elements further comprises a resilient tapered contact portion for extending partially into a hole of a circuit board and for resiliently engaging and mating with a conductive rim of said hole of said circuit board adjacent said integrated circuit, whereby forces generated by the resilient engagement of said contact portion with said rim of said circuit board tend to back said contact portion out of mating engagement with said conductive rim of said hole, said fastening means coupled to said integrated circuit package and said circuit board, said circuit board having a plurality of holes having conductive rims, said fastening means for releasably fastening said tapered contact portions of said conductive lead elements in mating relationship with said conductive rims of said holes of said circuit board adjacent said integrated circuit and thereby overcoming said forces tending to back said contact portion out of mating engagement with said conductive rims of said holes.

2. An integrated circuit package according to claim 1, wherein:
    each said lead element comprises a bifurcated cone.

3. An integrated circuit package according to claim 1, wherein:
    said resilient tapered portion of said lead element is bent substantially into v-shape, and
    the end of said lead element at said resilient tapered portion extends outside said hole of said circuit board when said resilient tapered portion is resiliently mated with said conductive rim of said hole of said circuit board.

4. An integrated circuit package according to claim 3, wherein:
    said integrated circuit package is a plastic dual-in-line package having an encapsulating plastic body.

5. An integrated circuit package according to claim 4, wherein:
    each said lead element extends horizontally from said encapsulating plastic body, and is bent downward to provide axial compliance of said lead element along an axis perpendicular to the horizontal.

6. An integrated circuit package according to claim 1, wherein:
    each said lead element comprises a thin wire having three or more bends.

7. An integrated circuit package according to claim 6, wherein:
    said three or more bends comprises at least five bends, with a first bend of approximately one hundred twenty degrees, a second bend of approximately ninety degrees, a third bend of approximately sixty degrees, a fourth bend of approximately ninety degrees, and a fifth bend of approximately one hundred twenty degrees, such that first and second ends of said thin wire are parallel, and said thin wire is substantially radially compliant.

8. An integrated circuit package according to claim 7, wherein:
said integrated circuit package has an encapsulating plastic body, and said first and second ends of said thin wire extend into said encapsulating plastic body.

9. The combination of claim 1, wherein:
said flexible fastening means comprises a base section which couples to said circuit board, a flexible post means extending from said base section, said flexible post means being substantially perpendicular to said circuit board, and a lip means extending from said flexible post means for engaging a top surface of said integrated circuit package.

10. The combination of claim 9, wherein:
said base section comprises an extension of said flexible post means, said extension for extending through a hole in said circuit board, and a barb means and stop means extending from said extension to hold said extension firmly in said circuit board when said stop means is located along a first surface of said circuit board adjacent said integrated circuit, and said barb means is located along a second surface of said circuit board remote from said integrated circuit.

11. The combination of claim 9, wherein:
said base section comprises a guiding plate means having at least one tapered guide hole, said guiding plate being a thin plate having its large surface substantially parallel to said circuit board, and said tapered guide hole overlying said hole of said circuit board and arranged to be larger in diameter away from said circuit board than adjacent said circuit board.

12. The combination of claim 11, wherein:
said flexible fastening means is coupled to said circuit board by bonding said guiding plate means to said circuit board;

13. The combination of an integrated circuit package and a fastening means,
said integrated circuit package having an integrated circuit and a plurality of conductive lead elements, first ends of said conductive lead elements being coupled to said integrated circuit, wherein each of said conductive lead elements further comprises a resilient tapered contact portion for extending partially into a hole of a circuit board and for resiliently engaging and mating with a conductive rim of said hole of said circuit board adjacent said integrated circuit, whereby forces generated by the resilient engagement of said contact portions with said conductive rims of said circuit board tend to back said contact portions out of mating engagement with said conductive rims of said holes,
said fastening means having a base section coupled to said circuit board, a flexible post means extending from said base section, said flexible post means being substantially perpendicular to said circuit board, and a lip means extending from said flexible post means for engaging a top surface of said integrated circuit package, said fastening means for releasably fastening said tapered contact portions of said conductive lead elements in mating relationship with said conductive rims of said holes of said circuit board, thereby overcoming said forces tending to back said contact portions out of mating engagement with said conductive rims of said holes.

14. The combination of claim 13, wherein:
said base section comprises an extension of said flexible post means, said extension for extending through a hole in said circuit board, and a barb means and stop means extending from said extension to hold said extension firmly in said circuit board when said stop means is located along a first surface of said circuit board adjacent said integrated circuit, and said barb means is located along a second surface of said circuit board remote from said integrated circuit.

15. An integrated circuit package according to claim 13, wherein:
said resilient tapered portion of said lead element is bent substantially into a v-shape, and
the end of said lead element at said resilient tapered portion extends outside said hole of said circuit board when said resilient tapered portion is resiliently mated with said conductive rim of said hole of said circuit board.

16. An integrated circuit package according to claim 15, wherein:
said integrated circuit package is a plastic dual-in-line package having an encapsulating plastic body.

17. An integrated circuit package according to claim 16, wherein:
each said lead element extends horizontal from said encapsulating plastic body, and is bent downward to provide axial compliance of said lead element along an axis perpendicular to the horizontal.

18. An integrated circuit package according to claim 13, wherein:
each said lead element comprises a thin wire having three or more bends.

19. An integrated circuit package according to claim 18, wherein:
said three or more bends comprises at least five bends, with a first bend of approximately one hundred twenty degrees, a second bend of approximately ninety degrees, a third bend of approximately sixty degrees, a fourth bend of approximately ninety degrees, and a fifth bend of approximately one hundred twenty degrees, such that first and second ends of said thin wire are parallel, and said thin wire is substantially radially compliant.

20. An integrated circuit package according to claim 19, wherein:
said integrated circuit package has an encapsulating plastic body, and said first and second ends of said thin wire extend into said encapsulating plastic body.

21. The combination of claim 13, wherein:
said base section comprises a guiding plate means having at least one tapered guide hole, said guiding plate being a thin plate having its large surface substantially parallel to said circuit board, and said tapered guide hole overlying said hole of said circuit board and arranged to be larger in diameter away from said circuit board than adjacent said circuit board.

22. The combination of claim 21, further in combination with an aligning means, said aligning means having at least one tapered pin sized to extend through said tapered guide hole of said guiding plate fit and to engage said hole of said circuit board, said aligning means for aligning said guiding plate relative to said circuit board prior to coupling said guiding plate to said circuit board.

* * * * *